United States Patent
Lambert

(10) Patent No.: US 7,966,159 B2
(45) Date of Patent: Jun. 21, 2011

(54) CONSTRUCTION METHOD

(75) Inventor: Malcolm McDonald Lambert, Annandale (AU)

(73) Assignee: Intresto Pty Ltd, Annandale, NSW (AU)

( * ) Notice: Subject to any disclaimer, the term of this patent is extended or adjusted under 35 U.S.C. 154(b) by 395 days.

(21) Appl. No.: 11/571,978

(22) PCT Filed: Jul. 13, 2005

(86) PCT No.: PCT/AU2005/000994
§ 371 (c)(1),
(2), (4) Date: Feb. 29, 2008

(87) PCT Pub. No.: WO2006/005106
PCT Pub. Date: Jan. 19, 2006

(65) Prior Publication Data
US 2008/0262800 A1    Oct. 23, 2008

(30) Foreign Application Priority Data
Jul. 15, 2004  (AU) ................................ 2004903910
Feb. 9, 2005   (AU) ................................ 2005900597

(51) Int. Cl.
*G06F 17/50* (2006.01)
(52) U.S. Cl. ........................................................ 703/1
(58) Field of Classification Search .................. 703/1
See application file for complete search history.

(56) References Cited

U.S. PATENT DOCUMENTS
4,692,876 A * 9/1987 Tenma et al. ................. 700/249
6,876,958 B1 * 4/2005 Chowdhury et al. ............. 703/7

OTHER PUBLICATIONS

Vivek A. Sujan et al., "Robotic manipulation of highly irregular shaped objects: application to a robot crucible packing system for semiconductor manufacture", 2002, Journal of Manufacturing Processes, vol. 4, No. 1, pp. 1-15.*
Grigore C. Burdea et al., "Solving Jigsaw Puzzles by a Robot", 1989, IEEE Transactions on Robotics and Automation, vol. 5, No. 6, pp. 752-764.*
Jonah C. McBride et al., "Archaeological Fragment Reconstruction Using Curve-Matching", 2003, Proceedings of the 2003 Conference on Computer Vision and Pattern Recognition Workshop, pp. 1-8.*
F. Lanaro et al., "3D characterization of coarse aggregates", 2002, Engineering Geology, vol. 65, pp. 17-30.*

(Continued)

*Primary Examiner* — Jason Proctor
*Assistant Examiner* — Russ Guill
(74) *Attorney, Agent, or Firm* — Moore & Van Allen PLLC; W. Kevin Ransom

(57) ABSTRACT

A method for construction of structures from blocks of building material, such as quarried rocks, which includes scanning irregularly or randomly shaped blocks of building material, the blocks having no pre-existing required arrangement, to obtain scan data representing the respective size and shape of each of the blocks. Each scanned block is uniquely identified and associated with the corresponding scan data. A virtual structure is determined, representing the size and shape of the structure to be constructed. Scan data is processed according to at least one predetermined criterion to choose at least one scanned block and determine a desired orientation and position of the at least one scanned block within the virtual structure; and build data is output, representing instructions regarding the desired position of the scanned block in the structure. Build data may be used to construct the structure one block at a time, or in batches of blocks.

21 Claims, 10 Drawing Sheets

OTHER PUBLICATIONS

J. Cagan et al., "A survey of computational approaches to three-dimensional layout problems", Computer-Aided design, vol. 34, pp. 597-611.*

Zuo Dai et al., "An octree-based heuristic algorithm for 3-D packing", 1994, Advances in Design Automation, vol. 2, pp. 125-133.*

John K. Dickinson et al., "Serial packing of arbitrary 3D objects for optimizing layered manufacturing", 1998, SPIE, vol. 3522, pp. 130-138.*

A. Bortfeldt et al., "A parallel tabu search algorithm for solving the container loading problem", 2003, Parallel Computing, vol. 29, pp. 641-662.*

David Goldberg et al., "A global approach to automatic solution of jigsaw puzzles", Apr. 2004, Computational Geometry, vol. 28, pp. 165-174.*

Manuel E. Sosa, "Optimal Packing of Three Dimensional Shapes using Genetic Algorithms", 1996, Massachusetts Institute of Technology, pp. 1-91.*

Arfath Pasha, "Geometric bin packing algorithm for arbitrary shapes", 2003, University of Florida, pp. 1-87.*

Manabu Hashimoto et al., "Vision system for object handling robot using a low-resolution range image and an intensity image", 2002, Systems and Computers in Japan, vol. 33, No. 7, pp. 21-29.*

H. Mara et al., "Automated extraction of profiles from 3D-models of archaeological fragments", 2003, Proceedings of CIPA 2003, six pages.*

Paul F. Whelan et al., "Automated packing systems—a systems engineering approach", 1996, IEEE Transactions on Systems, Man, and Cybernetics—Part A: Systems and Humans, vol. 26, No. 5, pp. 533-544.*

"Computer Scientists Tackle 1600-Year-Old Jigsaw Puzzle,"*SIAM News*, vol. 35, Jun. 2002.

Nguonphan et al., "Computer Modeling, Analysis and Visualization of Angkor Wat Style Temples in Cambodia," Pacific neighborhood Consortium, Annual Conference 2003.

Jacobs, G., "Bentley CloudWorx: An Overview of 3D Laser Scanning and Point Cloud," <http://web.archive.org/web/20040905221001/http://www.msmonline.com/productivity/default.cfm?objectid=B55EFE43-2205-4491-92DB6435BA2066C1&category=In%20Depth&method=display>.

Naai-Jung Shih., "Application of a 3D Scanner in the Representation of Building Construction Site", NIST SP 989, Sep. 2002.

Ben Kacyra, "Laser Scanning As-Builting System", Construction Innovation Forum, Nov. 2001; cif.org/nova-index.php.

Vivek A. Sujan et al., "Application of a Model-free Algorithm for the Packing of Irregular Shaped Objects in Semiconductor Manufacture"; Robotics and Automation, 2000, vol. 2, pp. 1545-1550; ISBN: 0-7803-5886-4.

* cited by examiner

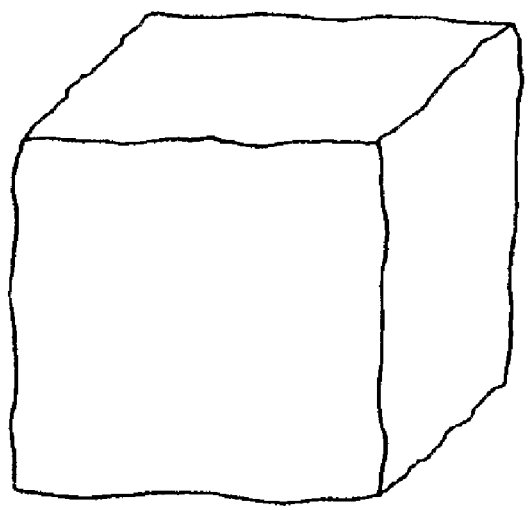
Figure 8a
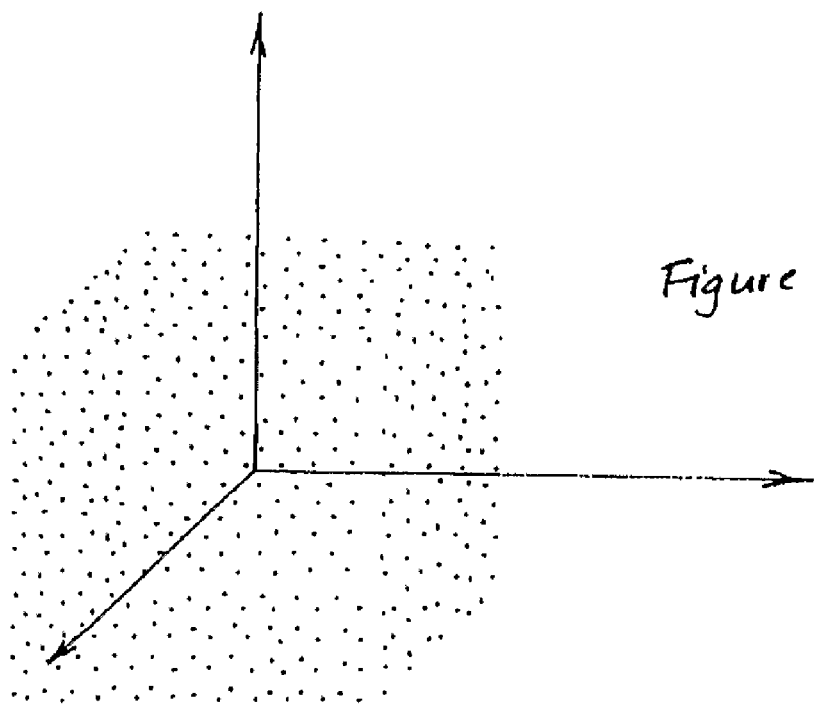
Figure 8b
Fig. 8

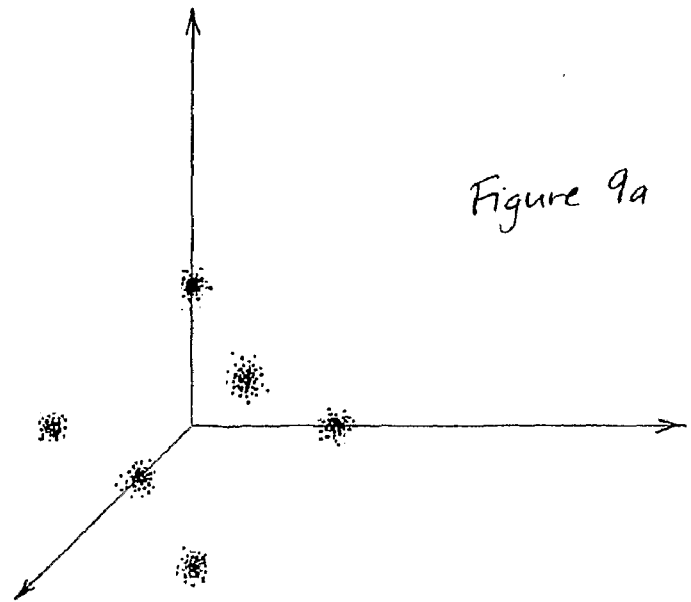
Figure 9a
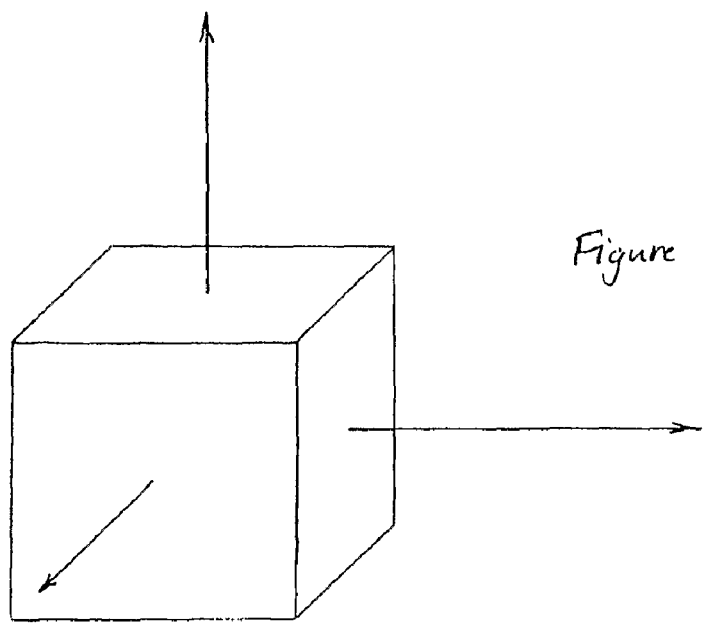
Figure 9b
Fig. 9

CONSTRUCTION METHOD

FIELD OF THE INVENTION

The present invention relates to methods of constructing structures, for example, walls or the like.

BACKGROUND

Walled structures built using natural rock rubble are a common and sought after type of wall. Although there is a range of tools available to the builder of rock walls for sourcing, transporting and lifting rock, the process of fitting randomly shaped rocks together to make a wall has remained essentially unchanged for thousands of years. A highly skilled stonemason is required to visually scan the top of the wall under construction and then inspect the available rock stockpile to select the next rocks to fit into the wall. While it is possible for unskilled wall builders to construct walls, the time taken to achieve the result is much longer, and the quality not as high. Even with a skilled stonemason, wastage, and a less than optimum choice and positioning of the rocks may occur. As a consequence of the high cost of labour, lack of accuracy, wastage and slow building process involved in the building of these types of structures, rough natural rock is under-utilised today as a building material.

The above discussion of background art is included to explain the context of the present invention. It is not to be taken as an admission that any of the documents or other material referred to was published, known or part of the common general knowledge at the priority date of any one of the claims of this specification.

SUMMARY OF THE INVENTION

According to a first aspect, the present invention provides a method of constructing a structure, including:

scanning a plurality of irregularly or randomly shaped blocks of building material, the blocks having no pre-existing required arrangement, to obtain scan data representing the respective size and shape of each of the blocks;

uniquely identifying each scanned block and associating each scanned block with the corresponding scan data;

determining a virtual structure, representing the size and shape of the structure to be constructed;

processing the scan data according to at least one predetermined criterion to choose at least one scanned block and determine a desired orientation and position of the at least one scanned block within the virtual structure; and outputting build data representing instructions regarding the desired position of the at least one positioned scanned block in the structure.

Preferably, the scan data for a plurality of blocks fulfil the predetermined criteria, and one of these scanned blocks is chosen to be placed within the virtual structure.

Preferably, the processing includes using the scan data to create at least one virtual block corresponding to one of the scanned blocks, and choosing and positioning the at least one virtual block in the virtual structure.

The processing may also include extrapolating the faces of a positioned virtual block to define virtual spaces within the virtual structure, and placing a further virtual block within one of the virtual spaces. The extrapolating of the faces of the positioned virtual block, to define virtual spaces within the virtual structure, and the placing of a further virtual block within one of the virtual spaces, may be repeated until no more virtual blocks can be placed in the virtual structure.

In one form, the processing also includes creating extended virtual blocks, which extended virtual blocks are modified from the scanned blocks they represent. In another form, the processing also includes creating virtual block combinations, which combinations represent a plurality of scanned blocks, and which are placed within the virtual structure only in a determined configuration, regardless of their overall orientation and position within the virtual structure.

In one form, the virtual structure includes at least one corner and the at least one predetermined criterion includes a criterion to place at least one of the virtual blocks in the corner of the virtual structure.

In one form, the scan data representing each block is processed, and build data output, before the scan data representing a further block is processed. Alternatively, scan data representing a plurality of blocks is processed before build data is output.

In one form, the scan data represents a point cloud of points on the surface of the block, and the virtual block is generated by determining localised peaks in density of proximal points, each proximal point representing the point where a plane defined by three points in the point cloud is closest to a predetermined point relative to the point cloud.

In one form, the processing includes determining a two dimensional surface array of a location of the structure in which a block is to be fitted, determining two dimensional arrays of sides of at least one scanned block; and determining the coefficient of correlation between the surface array and a block array for multiple positions of the block, wherein the at least one predetermined criterion includes a minimum that the coefficient of correlation between the surface array and block array must be above. In this case, the two-dimensional surface array may be determined from block arrays of already positioned blocks. Alternatively, the distance between one or more pairs of adjacent points on adjacent blocks to be positioned is determined and their standard deviation and average must be within certain specified tolerances, and the rock-to-rock distance is never negative. Additionally, or alternatively, the volume of the overall space between all the blocks placed in a virtual structure may be minimised for those blocks. This could be achieved by a perturbation applied to blocks within the virtual structure, so that they are randomly rearranged into an orientation that optimises, to a required degree, the separation between the blocks.

Preferably, the method includes placing the at least one block in the structure according to the build data.

In one form, the top surface of each block in the top layer of blocks placed in the structure is scanned after completion of placing a predetermined number of blocks into the structure.

In one form, the at least one predetermined criterion is one of contemporary structural stability and/or contemporary design. The predetermined criterion may include a predetermined maximum separation of any part of two adjacent block surfaces. In another form, the at least one predetermined criterion includes a predetermined maximum deviation between one side of the virtual structure and an adjacent surface of each of the blocks. The predetermined criterion may determine a plurality of blocks, one of which is then chosen to be positioned within the virtual structure. The blocks are preferably rocks. The structure may be a wall or bridge or the like.

According to further aspects of the invention there are provided a carrier medium carrying processor readable code containing instructions to control a processor to carry out the method of the first aspect, and a system including a storage component to store processor readable code containing instructions to carry out the method of the first aspect, and a processor to carry out those instructions.

Forms of the invention allow a trial and error approach to the fitting of randomly or irregularly shaped blocks of building material, such as rocks. It may be that several blocks may fit into a particular part of the structure to be constructed, and the appropriate block may be chosen at random from the suitable blocks. Additionally, criteria, such as strength and stability criteria may be used in determining where blocks should be placed in the structure, in order to give the structure load bearing capacity, for example.

Forms of the invention allow a structure to be constructed using a random selection of blocks of building material. A complete structure may be formed from the random selection of blocks. The random selection of blocks may be a random selection from a quarry, in the case where natural rock is used as the building material. The blocks have no pre-existing required arrangement, i.e. they are not rearranged into any previously predetermined required arrangement, and are not required to be arranged in any one unique arrangement before arrangement commences. Once the blocks are arranged, they produce a structure with a unique and new arrangement and orientation of the blocks that make up the structure.

It will be appreciated that various alterations and/or additions in the particular construction and arrangement of parts previously described may be made without departing from the spirit or ambit of the present invention.

BRIEF DESCRIPTION OF THE ACCOMPANYING DRAWINGS

Specific embodiments of the invention will now be described, purely by way of example, with reference to the accompanying drawings, in which:

FIG. 1b shows a further flow diagram showing more detail of part of the method of FIG. 1a;

FIGS. 8a and 8b show a block approximating a cube, and a resulting point cloud in 3D space; and FIGS. 9a and 9b show a set of proximal points defined by planes passing through the points show in FIG. 8b, and a virtual rock defined by the proximal points, respectively.

DETAILED DESCRIPTION

Figure 1A:
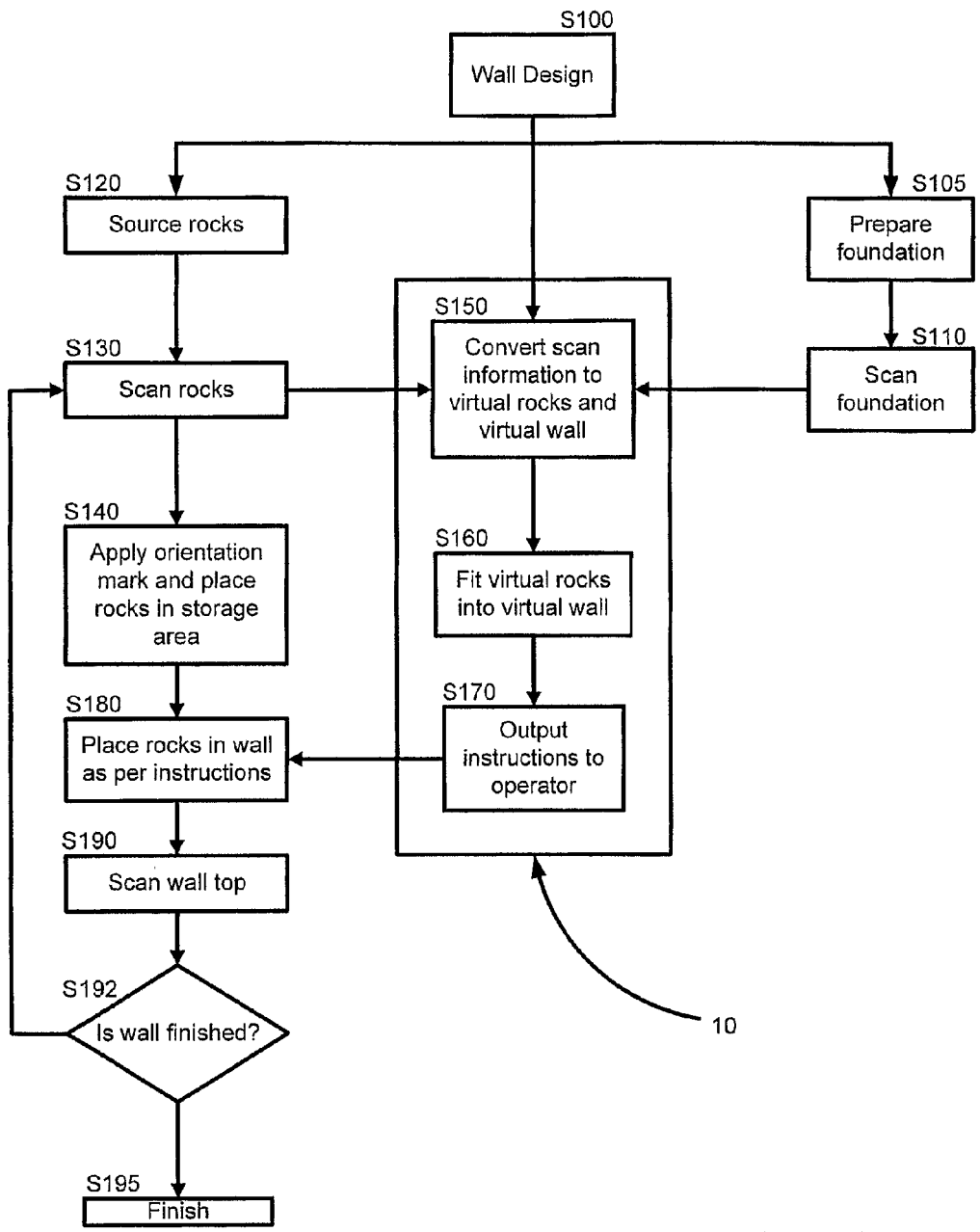
FIG. 1a shows a flow diagram of a method according to an embodiment of the invention.

FIG. 1a shows a flowchart for a method of carrying out an embodiment of the invention. The method starts at S100 when a user chooses the type of wall required. The size and shape of the wall to be built is determined and input into a computer 10 and the size and shape of a virtual wall (VW), corresponding to the wall to be built, is determined by the computer 10. The wall may be a simple wall with three fixed values for the dimensions, or may be more complicated, for example having varying height along its length. The wall may be a part of a building to be built, for example a house, or may be a dividing wall. The foundation is prepared in a conventional manner at S105. The foundation may be prepared before or after the size and shape of the virtual wall are determined. At S110 the top surface of the foundation is scanned and the foundation data input into the computer 10. Alternatively, the foundation data may be obtained from the engineering specifications of the structure to be built. Also following S100, and performed in parallel with S105 and S110, irregularly or randomly shaped blocks of building material are sourced at S120, for example from a quarry, and scanned into the computer 10 at S130. Alternatively, the virtual structure may be defined after the rocks are sourced and scanned, and the structure constructed using the materials available. In one embodiment, previously unused stone rocks are used as the blocks. In embodiments, the rocks are not pre-selected for any fine requirements, but may be selected on general size, for example, having a maximum dimension between two values such as 0.05 m and 0.5 m. Of course, other and/or additional general preselection tests might be used.

In one embodiment, rocks are placed on a conveyor belt and scanned by one or more scanners located on the conveyor belt. The scanners themselves may be of a conventional type, and are together able to obtain scan data, representing the size and shape of each rock, to be passed to the computer 10.

Following sourcing rocks at S120 and scanning them at S130, the rocks are marked with an orientation mark and individually identified by placing the rocks in a numbered grid storage area at the building site. For example, a storage area measuring 13 metres by 20 metres, divided into 0.5 metre squares identified by the letters A to Z on one side and the numbers 1 to 40 on the other, could store up to 1,040 rocks. The single storage area could provide rocks for several walls being constructed simultaneously.

If space is limited, fewer rocks need to be scanned and placed in the storage area if less stringent fitting criteria are applied, if rocks are pre-selected for their "ease-of-fit" shape (as discussed later) or if longer sections of wall are being constructed simultaneously, resulting in more possible positions for new rocks to be placed.

The rocks could have two marks of different colour applied by two pieces of chalk over which the rocks pass whilst on the conveyor belt in order to mark the orientation of the rock. In a further alternative, a more sophisticated marking scheme could be employed to identify each rock with a number, applied using paint that could be removed later if the number were to be on a visible wall surface.

In some circumstances, the orientation mark may need to be coincident with some visible feature on the rock surface. For example, the building design may require visible surface features such as strata to conform to a predetermined pattern in the finished wall or visible surface features such as strata or grain orientation may indicate the preferred orientation of the rock within the wall to produce optimum strength or weather resistance.

In brief, at S150 the computer 10 converts the scan data for a first batch of rocks into virtual rocks (VR). Additionally, the foundation data is used to determine the shape and contours of the base of the virtual wall. At S160, the computer 10 fits the virtual rocks into the virtual wall in positions and orientations determined by the computer 10. Once a single layer of the virtual wall has been created, the computer 10 then outputs build data representing instructions on the positioning of a layer of scanned rocks corresponding to the fitted virtual rocks to the operator at S170. Alternatively, the system may require more rocks to be scanned before a layer is finished if none of the remaining virtual rocks will fit into the wall. At S180 an output is received from the computer 10 to place the chosen scanned rocks in the determined positions and orientations.

Following placement of the rocks in the wall, at S190 the top of each of the physical rocks so far placed in the wall is scanned. The top surface of the wall under construction is scanned to create a digital representation of the wall under construction to account for inaccuracies in rock placement and cumulative errors as the wall is being built. The scanner may be mounted on a rail running above the wall or alternatively one or more fixed scanners may be provided, which cover areas of the top of the wall under construction.

The scanned rocks and the digital representation of the top surface of the wall are treated as virtual rocks and a virtual wall top. The shape of the wall top can be accurately interpolated by the computer 10 by combining the scanned position and orientation of the top surface of each scanned rock on top of the wall with the known dimensions of the scanned rocks.

The wall top, as seen from above by the scanner, becomes a surface consisting of polygonal faces. As scanned rocks are added, these faces intersect with each other and with the virtual wall to form virtual spaces (VS) into which more scanned rocks will fit.

At S192, whether the wall is finished is determined. If the wall is determined to be finished then the method finishes at 195. If not, the method goes back to step S130 and one or more rocks are scanned, if required. If there are still sufficient virtual rocks unused in building the wall, then S130 may be skipped on each repetition of the method, until more scanned rocks are required. The computer 10 completes steps 150, 160 and 170 for the next layer of rocks, before placing the rocks in the wall as per instructions at step S180. This repeats until the wall is finished.

Figure 1B:
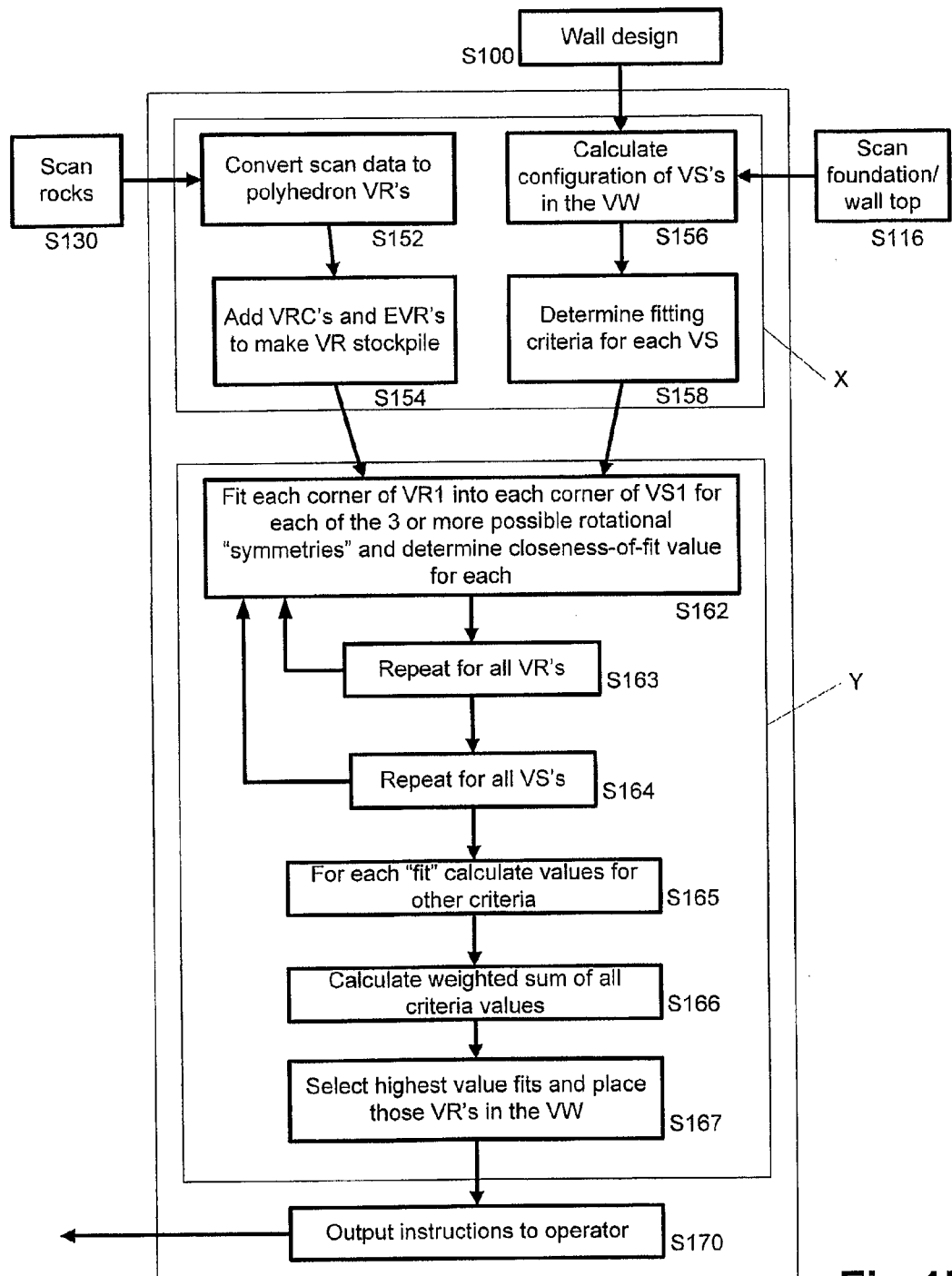

FIG. 1b shows the detailed steps taken by the computer 10 in the method shown in FIG. 1a. Step S150 of FIG. 1a can be further broken up into receiving scan data representing the rocks, as depicted inside box X. The rocks can be scanned to varying degrees of accuracy depending on the type of wall under construction. A low accuracy representation of the rocks may be suitable for a low height wall or a small section of a wall, whereas an archway or high wall may require a high accuracy representation due to the need for high stability.

S152 converts the scanned data from the rock into a 3D representation of the rock (virtual rock). The computer 10 constructs a point cloud digital representation of the rock as scan data, from the scanner outputs. The point cloud could be obtained from the outputs of two vertical linear arrays of single, fixed distance measuring lasers mounted either side of the conveyor, combined with the speed of the conveyor belt. The output is effectively two sets of point clouds representing the rock as viewed from two opposite directions. Fixed arrays of lasers allow the two point clouds to be easily combined to form one "registered" point cloud.

Raw scan data for a block consists of a point cloud, being a set of points in 3D space corresponding to points on the surface of the block. For example, FIG. 8a shows a block that approximates a cube. The resulting point cloud in 3D space is shown in FIG. 8b.

Any three points from the point cloud can be used to define a plane. The attributes of the plane can be uniquely represented in a second 3D space by the plane's proximal point, the point where the plane comes closest to the origin of the original 3D space axes.

For each point in the point cloud, several planes can be defined by that point and two of its neighbouring points. Each such defined plane is then represented by a proximal point in the second 3D space. Proximal points are accumulated in the second 3D space for each point in the point cloud. The set of proximal points generated for the point cloud of FIG. 8b is shown in FIG. 9a.

In the second 3D space, shown in FIG. 9a, the places where localised peaks in density of proximal points occur define the major planes of the polyhedron representation of the scanned block. Virtual rocks are then defined by the space contained by the intersection of those planes, as shown in FIG. 9b. The polyhedron representing the scanned rock may need to be slightly larger than that defined by the average of the points in each of the localised peaks in the density of proximal points to ensure almost all points of the rock are inside the polyhedron.

Alternatively, other types of scanners or measurement techniques could be used to obtain 3-D digital scan data as representation of each rock.

The digital representation of the surface configuration of the rocks can be polyhedrons each with four or more polygonal faces, which intersect to form four or more vertices, to form a virtual rock. Higher accuracy representations can be converted to virtual rocks as polyhedrons with more polygonal faces and vertices. The shape of each polyhedron is defined by the number, shape and position of the vertices, points where three or more faces intersect. The dihedral angles between each of the faces forming the vertex and the length of the edges where those faces intersect are the values used to find rocks to fit into the wall to a first approximation.

Other attributes such as solid angle of vertices, area of faces, linear dimensions of faces and other measures, which define the configuration of faces with respect to each other may also be used to pre-select virtual rocks to fit into virtual spaces.

At S154, the virtual rocks are then compared with other virtual rocks (previously scanned and unused) to make suitable combinations, resulting in a virtual rock combination or a standalone virtual rock. Further, the virtual rocks are compared with other virtual rocks (previously scanned and unused rocks) to form virtual rock combinations (VRC). Virtual rock combinations are pairs or groups of rocks that are treated during processing as a single rock. For example, an optional pre-sorting may be carried out of virtual rocks of different colours (if colour data were also input into the computer 10), so that various colour combinations of rocks could be grouped together so that they would be placed in the wall in a fixed configuration. The virtual rock combination of step S154 can also be for example, two rocks, each shaped like a cube of width x, and can be considered to be separate virtual rocks or as one virtual rock being a square prism of width x and length 2x. The two rocks together form the virtual rock combination. Further, combinations of two or more virtual rocks could be considered as a single virtual rock by the method when trying to fit virtual rocks into virtual spaces in the wall, bearing in mind that each individual virtual rock within the virtual rock combination still needs to satisfy basic structural criteria when placed in the virtual wall.

Extended virtual rocks (EVR) are virtual rocks that are close to a particular shape, together with an extra volume that makes them, for example, a regular shape. The missing part of the virtual rock is effectively ignored in processing an extended virtual rock. Further, the extended virtual rock of step S154, could, for example, be a rock in the shape of a truncated square pyramid or a frustum which, when converted to a 6-faced polyhedral virtual rock could miss out on being fitted to a suitable square pyramid virtual space. In addition to the 6-faced virtual rock, another virtual rock, the extended virtual rock, is added to the stockpile of virtual rocks, that being the 5-faced square pyramid or the extension of the frustum. There could be several extended virtual rocks for each virtual rock.

Steps S156 and S158 (carried out in parallel with steps S152 and S154) calculate the configuration of virtual spaces, which are volumes into which the computer attempts to fit virtual rocks within the virtual wall, and determine fitting criteria for each virtual space into which a virtual rock, virtual rock combination or extended virtual rock is to be fitted, as described below.

Steps S152, S154, S156 and S158 provide input for fitting the virtual rocks into the virtual wall. Step S160 of FIG. 1a is further broken up into steps S162 to S167 (as depicted in box Y). Step S162 fits each vertex of a first virtual rock into each vertex of a virtual space and tests for each of the three or more possible rotational symmetries, determining the closeness of fit for each. For example, each vertex of a cube could be thought of as the apex of a triangular pyramid where there is a 3-fold rotational symmetry about the imaginary axis (or forming the apex of a square pyramid would have 4-fold rotational symmetry at its tip and 3-fold at each vertex of its base). So a roughly cubic virtual rock being tested for fit in a similar sized and shaped virtual space would be tested for fit three times for each vertex of the virtual rock in each vertex of the virtual space resulting in 3×8×8=192 sets of values representing closeness-of-fit. One set of values represents the possible variations in the orientation of a virtual rock once its vertex is places inside the vertex of a virtual space. For example, a vertex of a cubic virtual rock is placed in a virtual space with a vertex approximating that of a cube but where the vertex has a slightly larger solid angle. Six values of closeness-of-fit can be calculated for each of the situations where one face of the virtual rock is coincident with the adjacent face of the virtual space and the virtual rock has been rotated slightly so one edge of the virtual rock is coincident with the adjacent edge of the virtual space. In a further refinement of this method, the set of values for each vertex-to-vertex fit indicates the optimum orientation of the virtual rock vertex within the virtual space vertex, i.e. it may not be one of the orientations where a face and edge are coincident. The criterion is set for the closeness of fit to be within a predetermined value, i.e. the adjacent surfaces are within a predetermined maximum separation or the distance between several pairs of adjacent points spread across adjacent surfaces have their standard deviation and average within specified tolerances and that for rock-to-rock surfaces the distance is never negative. Other criteria for closeness of fit, such as minimising the volume of air-gap between surfaces, may be used. S162 is then repeated for all virtual rocks at S163, and then repeated again at S164 for all further virtual spaces, as described in more detail below. Some of the smaller virtual spaces can be ignored if by doing so the structural or design criteria are not compromised.

Once the closeness of fit for all of the virtual rocks and further virtual spaces have been determined in S162, S163 and S164, at S165 values for each closeness of fit are calculated, including any other criteria, as discussed below. S166 then weights the sum of the criteria values in order to select the highest value fit at S167 and place that virtual rock in the virtual wall. Additionally, S166 also rejects virtual rocks that might be unstable or lead to unstable virtual space configurations. The rejection criteria could be determined on a wall-by-wall basis. The instruction is then output to the operator at S170 who can easily select the rock from the stockpile as each rock has been identified at S140 of FIG. 1a. Distances by which rocks are to be separated (kept apart by mortar or other spaces) may be included in the instructions. The instructions might include details of how a scanned rock is to be reduced in size in a particular way. The overall method is repeated until the wall is built.

Figure 2:
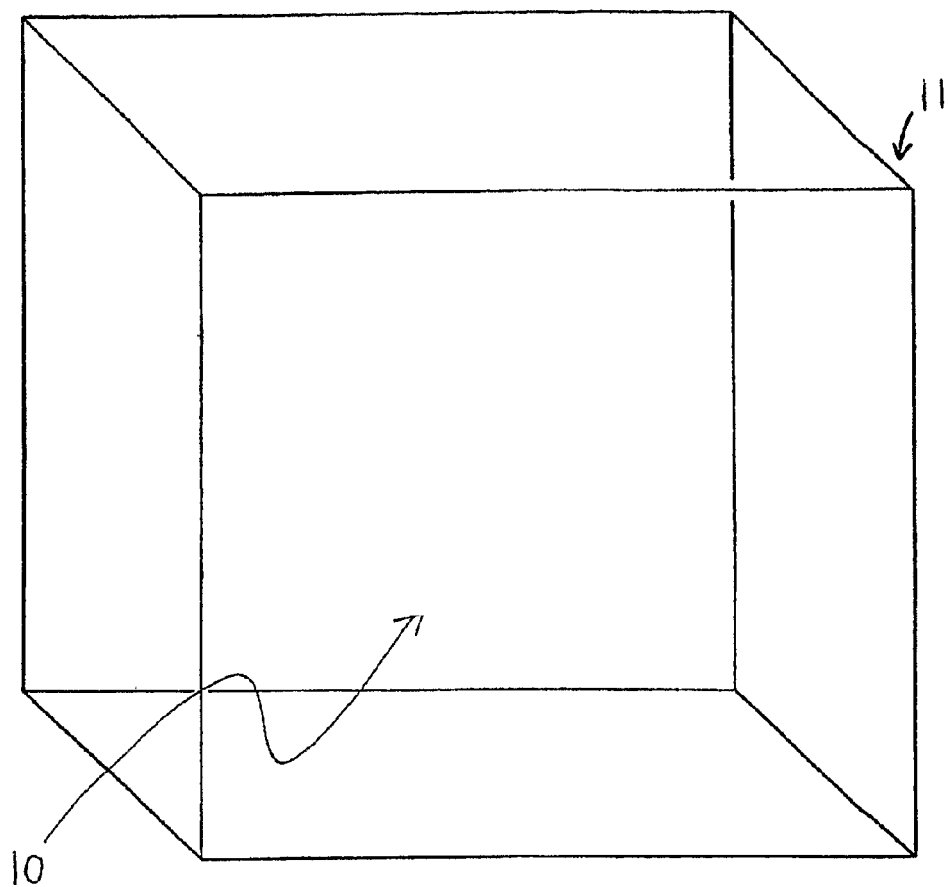
FIG. 2 shows a virtual wall (VW)

FIGS. 2 to 7 illustrate an example of steps S162-S167 (as depicted in box Y of FIG. 1b) being carried out. FIG. 2 illustrates the virtual wall 10 prior to any rocks being placed. The virtual wall outer boundary 11 is in this case rectangular, but could take any shape that is desired. For, example the wall may take the form of a retaining wall, or a bridge being a specific type of wall. Additionally, it might be used in sculptures and the like.

Figure 3:
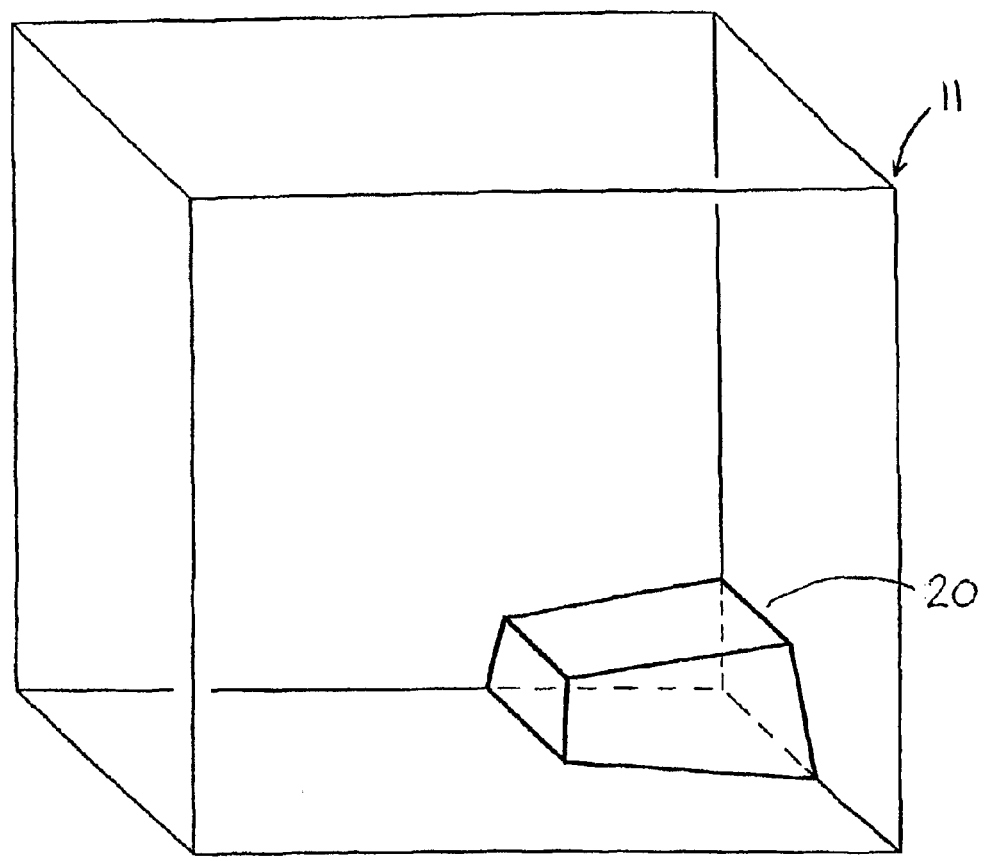
FIG. 3 shows a virtual wall and virtual rock (VR) placed within it.
Figure 4:
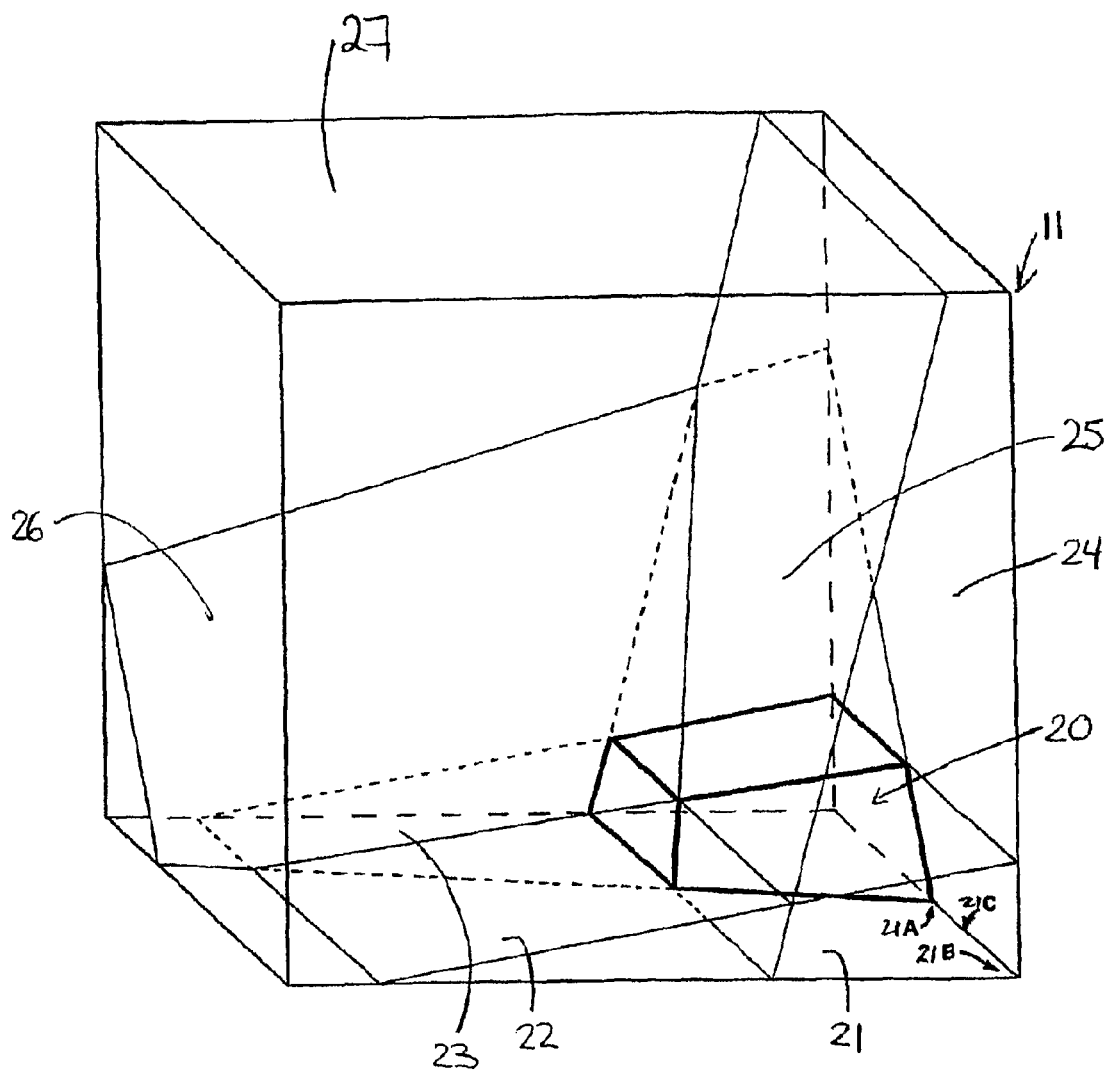
FIG. 4 shows the virtual wall of FIG. 3 with a virtual rock placed in it, and also shows virtual spaces (VS) defined by the extended faces of the virtual rock and the sides of the virtual wall.

FIG. 3 shows the first virtual rock 20 to be placed in the virtual wall 10. The first virtual rock is chosen as one that has at least one vertex with 3 faces intersecting at right-angles, so that it can be placed in a corner of the virtual wall 10. The placement of the first virtual rock 20 in the virtual wall then divides the remaining space into several virtual spaces 21, 22, 23, 24, 25, 26, 27 as shown in FIG. 4. Each virtual space is formed by the intersection of virtual rock faces, the continuation of the planes formed by virtual rock faces and the virtual wall outer boundary 11.

The selection of each virtual rock to fit into each further virtual space in the virtual wall 10 is dependent on several conditions. FIG. 4 shows the first virtual rock 20, which defines a virtual space 21, formed by one face of the first virtual rock, the continuation of the planes of two of its other faces, and three sides of the virtual wall outer boundary 11. A second virtual rock [not shown] with at least one vertex having the same characteristics as at least one vertex of the further virtual space 21 is selected as a potential candidate for placement in the further virtual space 21.

For example, virtual rocks, which have a vertex with angles corresponding closely to those of the further virtual space vertex at 21A, are selected from the stockpile. The selection is further reduced to those that also have a neighbouring vertex having three faces at right-angles, to fit the further virtual space vertex at 21B, and an adjoining edge with length equal to or shorter than that of edge 21C. Other patterns of selection procedures may be used to find from the virtual rock stockpile suitable virtual rocks to fit into each virtual space.

Figure 5:
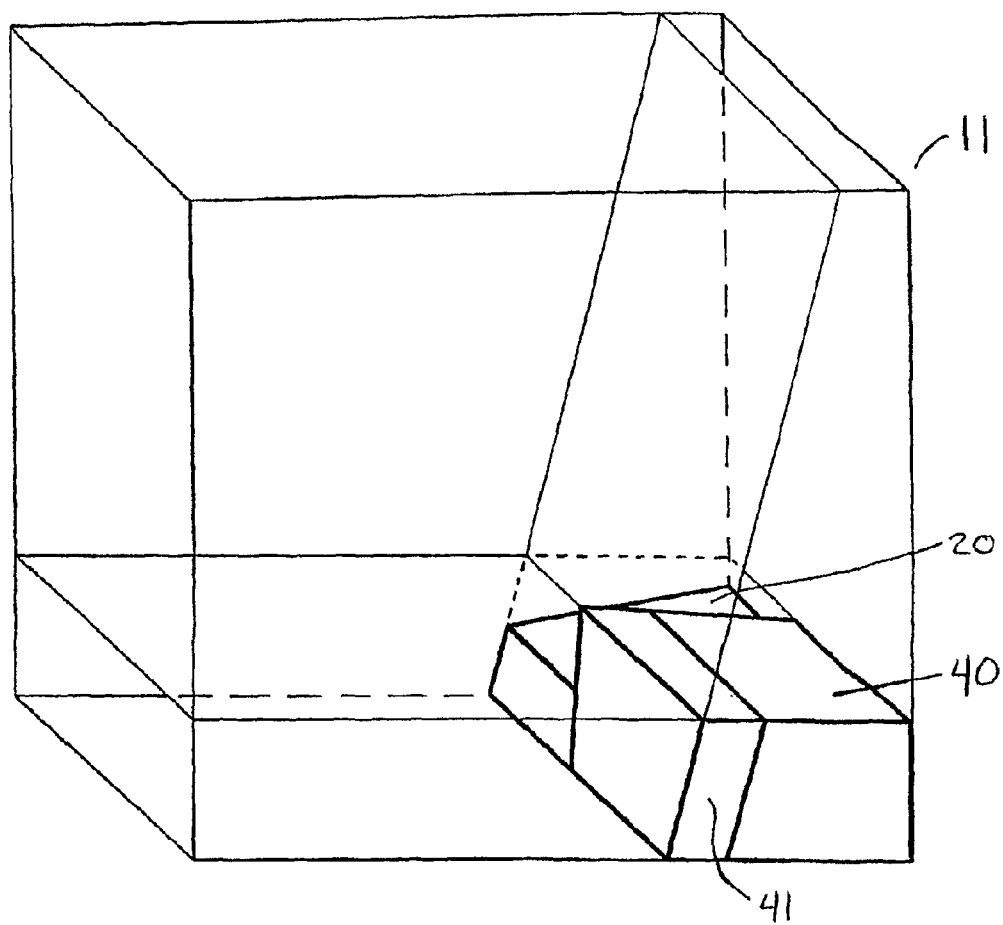
FIG. 5 shows the virtual wall of FIG. 4 with additional virtual rocks placed within one of the virtual spaces.
Figure 6:
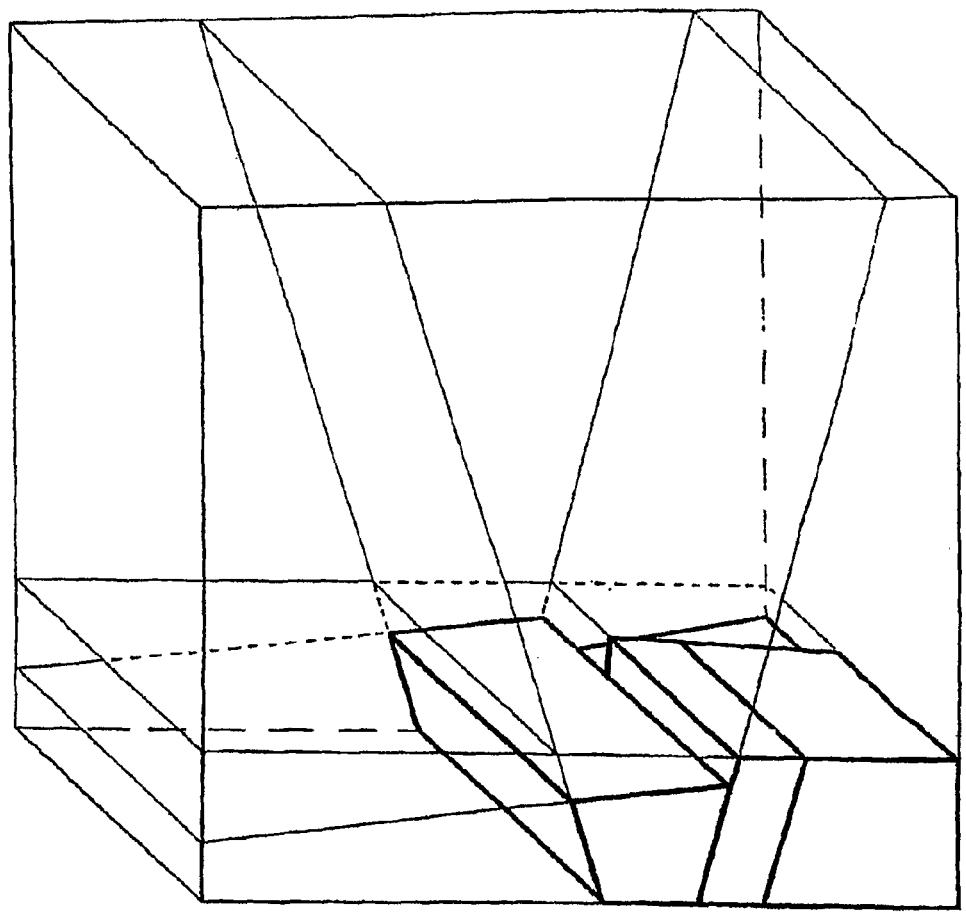
FIG. 6 shows the virtual wall of FIG. 5, with an additional virtual rock placed in position and further virtual spaces defined.

Generally, a virtual rock must fit within the virtual wall outer boundary 11 and the faces of already placed virtual rocks, but it does not always have to fit within other faces of virtual spaces within the virtual wall. However, FIG. 5 illustrates a case in which the virtual rocks are required to fit within the other faces of a further virtual space. In this case second virtual rock 40 is placed alongside first virtual rock 20 and third virtual rock 41 is selected so that it leaves room for a fourth virtual rock (not shown) which will be placed along the face of the first virtual rock 20 and third virtual rock 41 to extend from one side of the virtual wall 10 to the other as shown in FIG. 6.

Virtual rocks are also selected based on general suitability criteria, to ensure the finished structure meets minimum standards of strength, durability and weather resistance, such as: larger virtual rocks being chosen for the base of the wall and for corners; arranging virtual rocks such that their longest dimension runs into the wall; interlocking rocks placed at the same height in the wall to increase wall strength; or selecting virtual rocks so that, when placed, their top faces are close to horizontal and nearly coincident with the top faces of neighbouring virtual rocks to allow the next course of virtual rocks to bridge vertical joints. In effect, rocks are selected so that when placed, each rock touches the greatest number of neighbouring rocks. Further, any sloping surfaces of virtual rocks oriented and placed in the virtual wall such that the forces will be directed into the wall when it is built, i.e. rocks should not fall out of the wall or push the wall apart under the force of gravity, selecting rocks which extend from one side of the wall to the other as often as possible. Rocks placed so they are contained wholly within the wall may have some of their suitability criteria applied less rigorously. So long as stability criteria are adhered to, it may be possible to also select rocks that, when placed, direct water falling on the wall in a preferred direction. Horizontally adjacent rocks in the wall may be arranged so that the relative heights of their adjacent tops edges are close to coincident. Also, they may be chosen so that the camber of the adjacent top edges of such rocks is in the same direction, so that the tops of the rocks are close to parallel where they are adjacent to one another. In this way, the number of small rocks required to fill spaces left where adjacent rocks produce a 'step' between them, may be reduced.

The selection of rocks may also depend on the type of wall to be built (e.g. a retaining wall, a sea wall, a dam wall, a bridge, an archway or a wall with an insulating gap) or on the type of rock laying procedures (e.g. a dry stone wall compared with a stone and mortar type wall). The selection of rocks may also depend on what part of a wall is being built, for example, non-porous rocks for lower sections in contact with the ground to reduce problems associated with damp. Rocks may be selected from the available stockpile for various parts of the wall during construction or may be pre-selected at the quarry for various types of walls. Rocks may be pre-selected for aesthetic or structural qualities. It may be found that certain rock shapes fit easily together so that these types of shapes are pre-selected and transported to building sites that have limited space for storage and/or have the requirement to minimise wastage.

Figure 7:
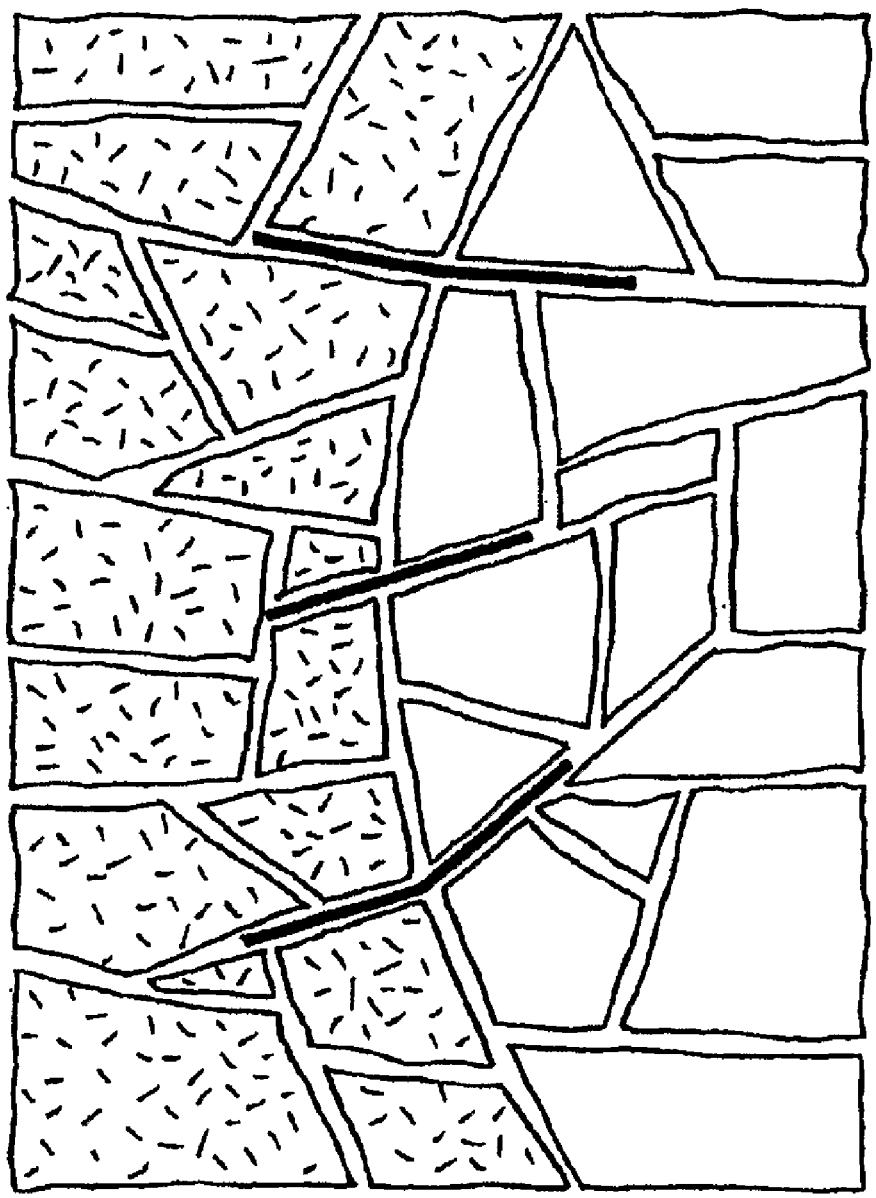
FIG. 7 shows a wall including reinforcing rods embedded in mortar between placed rocks.

As shown in FIG. 7, as well as accommodating for various wall shapes, the rocks can be selected for a wall incorporating reinforcing rods or other inclusions. For example, if rocks of different colours are used, they can be selected to conform to a predetermined pattern. Rocks of a single colour could also be selected to conform to a predetermined pattern. Additionally, where the rocks have a distinctive surface pattern, these rocks can be marked so that the appropriate orientation is known, and then positioned so as to create an overall pattern with a number of such rocks. Short reinforcing rods could be used to tie the areas of different colours/patterns together to compensate for any increase in occurrence of continuous vertical joints as shown in FIG. 7 because the selection of rocks is based mainly on appearance.

Once a layer of virtual rocks has satisfied the predetermined conditions of closeness of fit, stability and conformity to wall shape, and has been positioned and orientated in the virtual wall, the result is output to the operator to physically place the rock in the wall in the desired position and orientation.

The output may be in the form of a computer screen located beside the wall, which displays a representation of the wall in front of the operator. It also identifies the rock to be placed and its orientation and where in the wall it needs to be placed. The output could be to a heads-up display, or a display shown only to one eye of the worker, the other eye seeing the real wall. Alternatively, the output could be directed to an automated machine which, upon receiving the information about the rock and the wall, selects the rock from the storage area, orients the rock correctly and places the rock in the rock wall. This would be particularly suitable for large rocks or large walls.

Following placement of the rock, the method is repeated and the next suitable rock is output to the operator or automated machine and is placed. In between placement of rocks the operator or machine can apply mortar or other reinforcement such as tie rods between rocks, to secure the rocks in place if required. For cavity walls, tie bars between the two walls can be installed during placement of rocks. Further, for cavity walls, at various stages during construction, insulating foam could be pumped into the cavity. If the insulating foam conforms to the inner wall surfaces and then sets into solid foam then it would both insulate and strengthen the wall.

A variation, being a hybrid of the cavity wall and the solid mortared wall, is possible where the wall is designed so that each face of the wall has mortared joints between rocks but spaces between rocks within the wall are left un-mortared. This type of wall would be suitable as an internal wall where the high thermal mass properties of the wall are utilised by circulating warm air from the sub-roof space through the wall during winter daytime or outside cool air through the wall during summer night-time.

Selection and placement of rocks based on the computer output is repeated and as rocks are taken from the storage area to be used in the wall, more rocks are scanned to replace them. In the present embodiment, the top surface of the wall is scanned at various intervals during construction to take account of inaccuracies and cumulative errors.

Variations in this scheme could occur. For example, in walls consisting of large rocks, the wall-top scan information could be sent directly to the quarry where the next lot of rocks are selected, numbered and transported to the site where they can be placed directly into the wall.

The frequency of scanning the top surface of the wall may be reduced if a small wall or walls made from small sections is required. Further, the frequency of scanning may be reduced if the rocks can be scanned and placed in the wall to a high degree of accuracy.

Alternatively, the virtual wall could be constructed entirely in the computer before the real wall is started. In this case, the rocks could be scanned at a quarry, individually numbered and then only those rocks used in constructing the wall transported to the building site. Larger walls constructed this way may be possible if the rocks are placed in the wall to a high degree of accuracy in position and orientation. A wall-top scanner may be used in this case to aid in the accurate placement of rocks. In this case, the wall would be composed of only one virtual wall, generated and output before any placement of the rocks of the wall took place.

A similar alternative, but for a large number of rocks scanned on site, is the possibility of constructing the virtual wall, or part thereof, many times within the computer. The virtual wall is successfully completed each time within the computer but with a different configuration of the available scanned virtual rocks each time. The configuration, or selection of possible configurations, which best satisfies the design criteria is output to the operator. The design criteria include structural stability and optimisation of use of rocks. The construction of a complete virtual wall within the computer can start from any or several points within the virtual wall, i.e. it does not have to start from the bottom up as in a real wall.

Scanning rocks at a quarry has the advantage that many thousands of rocks can be scanned and stockpiled for later use. Rocks approximating certain shapes used, for example, in corners or arches could be separated from the general stockpile and saved for when such shapes are needed.

Because of the large number of scanned rocks available at the quarry for placement in a wall it may sometimes be advantageous to actually construct a wall at the quarry before then dismantling it and transporting the numbered rocks to the building site. As with the walls constructed only virtually at the quarry, the foundation at the building site should conform accurately to that at the quarry and the final rock placement must be done accurately so as to avoid cumulative errors. A computerised virtual wall display showing where rocks are to be placed and an above-wall scanner at the final building site may be used to aid the accurate placement of rocks. This method may reduce the amount of material transported and the amount of construction time at the building site, while ensuring the best fit of rocks in the wall, due to the large choice of rocks in the stockpile at the quarry.

Alternatively, pre-built wall sections assembled at the quarry could be transported to the building site inside a wire cage. At the building site, the wall section would be lowered onto the foundation (or previously placed wall section), sandwiching a layer of wet concrete between it and the foundation. The sides of the cage can then be removed and the cage base left in place as reinforcing included in the concrete. Wall sections could be placed between building columns to produce an effect similar to brick-nogging. Alternatively, wall sections could be placed next to other wall sections with the joins filled by rocks, numbered and transported to the building site, selected by the computer at the quarry to fit into the gaps. Reinforcing bars could be included in the wall section during construction at the quarry then attached to columns or other wall section reinforcing at the building site. If mortar is not used during construction of the wall section at the quarry it could be pumped via a tube into gaps between rocks once the wall section has been placed on its foundation at the building site.

An advantage of the method used above to determine closeness of fit in particular at S162 above, is that it uses a low number of computations. Alternatively, a different method of calculating closeness of fit values can be used at S162, which is a more empirical method. In an alternative embodiment, the top of the wall, after it has been scanned, is represented in the computer by a two dimensional array of numbers. Each number represents a value for one of the three dimensions, the array being a plane in the other two dimensions, in this case, the height of the wall at that point in the horizontal array. Similarly, the raw data from a single scanner after a rock has been scanned is a two-dimensional array representing the distance of the rock surface from the scanner. To test the rock for closeness-of-fit in the wall, the 2-D envelope of the rock's array of numbers (as "viewed" from one direction) is matched to a section of the wall's array and the coefficient of correlation between the two is calculated. The rock's array is then correlated with a new section of the wall's array, the same shape as the first but shifted along the wall by a small amount. In this way, a one-dimensional array of numbers is generated representing the correlation coefficient of the rock and wall at various points along the wall.

The overall number of correlation calculations to find the position and orientation of best fit for any one rock can be reduced by restricting rock orientations that are tested this way. For example, the rock could be tested for fit by the correlation method in orientations where one of the rock faces coincides with the side of the wall. The rock could be rotated about a perpendicular to that face in steps of 1 degree from 1 to 360 degrees and the correlation coefficient calculated for each step. If a rock has 6 faces and is tested at 100 points along a wall then a 6×100×360 array of correlation coefficients is generated after 216,000 2-D cross-correlation calculations. The same rock which is to be tested for fit where it is completely within the wall will require many more calculations to account for more than just the 6 possible starting orientations.

Other virtual rock fitting computer programs could be based upon a measure of the "density" of a wall or wall section. For example, a virtual rock fitting computer program could use a mathematically applied "vibration" to a selection of virtual rocks placed at random into the virtual wall boundary with walls extended upwards to prevent virtual rocks virtually falling out. A measure of total closeness-of-fit could be the density of the wall below a certain height, where higher densities reflect lower volume of air spaces between rocks. An optimisation program would search for peaks in the density space as virtual rocks are vibrated, then reject peaks which fall below a specified level and which fail other structural or design criteria. Such a method could be further refined by steering the vibrating virtual rocks in the right direction by, for example, pre-selecting the virtual rocks placed in the virtual wall so larger rocks are on the bottom, applying a force to virtual rocks near the virtual wall sides such that the virtual rocks tend to have one face coincident with the virtual wall side, top and bottom faces close to horizontal and the longest dimension running into the wall, etc.

Other virtual rock fitting computer programs may be employed using other mathematical methods. For example, neural networks could be employed to "learn" through experience how to best fit virtual rocks together so they combine to create a structure which satisfies all structural and design criteria.

It is not always desirable to select the best fit as outlined in step S167. For example it would be undesirable for the method to always preferentially select rock shapes that lend themselves to fitting together more easily (such as rocks with right-angle edges or parallel faces). If the rock stockpile is limited, it is possible that the stockpile may become populated by more difficult to place rocks, such as rocks with curved edges, concave surfaces, etc. In order to avoid this, in an alternative embodiment, step S167 ensures a difficult to place rock is occasionally used when it is suitable for placement even if there is a rock with a higher value of fit.

In the embodiments described above, the virtual structure may be positioned between existing structures, and certain boundaries of the virtual structure may be defined by the physical boundaries of adjacent structures. Additionally, rocks having regular features may be placed at boundaries of the virtual structure. For example, straight edged and flat faceted rocks may be placed at the ends of a wall to give a smooth edge to the end of the wall, with randomly shaped rocks being used to fill in between the two ends.

The present invention has been described above purely by way of example and alterations, omissions and modifications can be made, the invention extending to such modifications, omissions and alterations. Although embodiments of the present invention has been described specifically in relation to rocks, it will be apparent that other irregularly or randomly shaped blocks of building material could also be used. Additionally, although construction of a wall has been described in embodiments of the present invention, this invention will also apply to other structures such as bridges, arches, sculptures etc. The present invention could also be applied to the fitting of randomly-shaped three dimensional structures, where the blocks conform to one another in one of their three dimensions, for example, they are all flat with a uniform width, with the other two being random, such as pavers, wall cladding or the like.

The present invention has been described above with the aid of functional parts illustrating the performance of specified functions and relationships thereof. The functional parts have been arbitrarily defined herein while describing embodiments of the invention. Alternate definitions can be defined so long as the specified functions and relationships thereof are maintained. The invention extends to any such alternate definitions. It will be seen that the functional parts can be implemented by application specific integrated circuits, discrete components, processors executing appropriate software and the like or any combination thereof.

The invention claimed is:

1. A computer-implemented method of constructing a structure, including:
   scanning into a computer memory a plurality of irregularly or randomly shaped blocks of building material, the blocks having no pre-existing required arrangement, to obtain scan data in a computer memory representing the respective size and shape of each of the blocks;
   uniquely identifying each scanned block and associating each scanned block with the corresponding scan data using a computer processor;
   determining a virtual structure, representing the size and shape of the structure to be constructed using a computer processor;
   processing with a computer processor, the scan data according to at least one predetermined criterion to choose at least one scanned block and determine a desired orientation and position of the at least one scanned block within the virtual structure; and
   outputting build data to an output device representing instructions regarding the desired position of the at least one positioned scanned block in the structure,
   wherein the scan data is three dimensional (3D) scan data representing the entire 3D surface configuration of each of the blocks, and
   wherein the at least one predetermined criterion is structural stability of the structure.

2. A computer-implemented method according to claim 1, wherein the processing includes:
   using the scan data to create at least one virtual block corresponding to one of the scanned blocks, and
   choosing and positioning the at least one virtual block in the virtual structure.

3. A computer-implemented method according to claim 2, wherein the processing includes:
   extrapolating the faces of a positioned virtual block to define virtual spaces within the virtual structure; and
   placing a further virtual block within one of the virtual spaces.

4. A computer-implemented method according to claim 3, wherein the extrapolating of the faces of positioned virtual blocks to define virtual spaces within the virtual structure, and the placing of further virtual blocks within one of the virtual spaces is repeated until no more virtual blocks can be placed in the virtual structure.

5. A computer-implemented method according to claim 3, wherein the virtual structure includes at least one corner and the at least one predetermined criterion includes a criterion to place at least one of the virtual blocks in the corner of the virtual structure.

6. A computer-implemented method according to claim 2 wherein the processing also includes creating extended virtual blocks, which are modified from the scanned blocks they represent.

7. A computer-implemented method according to claim 2, wherein the processing also includes creating virtual block combinations, which represent a plurality of scanned blocks, and which are placed within the virtual structure only in a determined configuration, regardless of their overall orientation and position within the virtual structure.

8. A computer-implemented method according to claim 2, wherein the scan data represents a point cloud of points on the surface of the block; and wherein the virtual block is generated by determining localized peaks in density of proximal points, each proximal point representing the point where a plane defined by three points in the point cloud is closest to a predetermined point relative to the point cloud.

9. A computer-implemented method according to claim 1, wherein the scan data representing each block is processed, and build data is output, before the scan data representing a further block is processed.

10. A computer-implemented method according to claim 1 wherein scan data representing a plurality of blocks is processed before build data is output.

11. A computer-implemented method according to claim 1, wherein the processing includes:
    determining a two-dimensional surface array of a location of the structure in which a block is to be fitted;
    determining two dimensional arrays of sides of at least one scanned block; and
    determining a coefficient of correlation between the surface array and a block array for multiple positions of the block,
    wherein the predetermined criterion includes a minimum coefficient of correlation between the surface array and block array.

12. A computer-implemented method according to claim 11, wherein the two-dimensional surface array is determined from block arrays of already positioned blocks.

13. A computer-implemented method according to claim 1 further including placing the at least one positioned scanned block in the structure according to the build data.

14. A computer-implemented method according to claim 13, wherein the top surface of each of the top layer of blocks placed in the structure is scanned after completion of placing a predetermined number of blocks into the structure.

15. A computer-implemented method according to claim 1 wherein the blocks of building material are rocks.

16. A computer-implemented method according to claim 1 wherein the structure is a wall.

17. A computer-implemented method according to claim 1, wherein the at least one predetermined criterion is structural stability of the structure without requiring external support.

18. A computer readable storage medium carrying processor executable code containing instructions to control a processor to carry out the computer-implemented method of claim 1.

19. A system including: a storage component storing processor executable code containing instructions to control a processor to carry out the computer-implemented method of claim 1; and a processor to carry out the instructions stored on the storage component.

20. A computer-implemented method of constructing a structure, including:
    scanning into a computer memory a plurality of irregularly or randomly shaped blocks of building material, the blocks having no pre-existing required arrangement, to obtain scan data in a computer memory representing the respective size and shape of each of the blocks;
    uniquely identifying each scanned block and associating each scanned block with the corresponding scan data using a computer processor;
    determining a virtual structure, representing the size and shape of the structure to be constructed using a computer processor;
    processing with a computer processor, the scan data according to at least one predetermined criterion to choose at least one scanned block and determine a desired orientation and position of the at least one scanned block with the virtual structure; and outputting build data to an output device representing instructions regarding the desired position of the at least one positioned scanned block in the structure, wherein the at least one predetermined criterion includes a predetermined maximum separation of any part of two adjacent block surfaces.

21. A computer-implemented method of constructing a structure, including:

scanning into a computer memory a plurality of irregularly or randomly shaped blocks of building material, the blocks having no pre-existing required arrangement, to obtain scan data in a computer memory representing the respective size and shape of each of the blocks;

uniquely identifying each scanned block and associating each scanned block with the corresponding scan data using a computer processor;

determining a virtual structure, representing the size and shape of the structure to be constructed using a computer processor;

processing with a computer processor, the scan data according to at least one predetermined criterion to choose at least one scanned block and determine a desired orientation and position of the at least one scanned block within the virtual structure; and outputting to an output device build data representing instructions regarding the desired position of the at least one positioned scanned block in the structure, wherein the at least one predetermined criterion includes a predetermined maximum deviation between one side of the virtual structure and an adjacent surface of each of the blocks.

* * * * *